United States Patent
You

(10) Patent No.: US 8,761,320 B2
(45) Date of Patent: Jun. 24, 2014

(54) APPARATUS AND METHOD FOR AUTOMATIC FREQUENCY PREDICTION CONTROL

(75) Inventor: Duk-Hyun You, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 152 days.

(21) Appl. No.: 13/324,335

(22) Filed: Dec. 13, 2011

(65) Prior Publication Data
US 2012/0163516 A1 Jun. 28, 2012

(30) Foreign Application Priority Data
Dec. 22, 2010 (KR) .................. 10-2010-0132736

(51) Int. Cl.
*H04L 27/06* (2006.01)
(52) U.S. Cl.
USPC .......................... 375/344; 375/316
(58) Field of Classification Search
USPC .................................. 375/344, 316
See application file for complete search history.

(56) References Cited

U.S. PATENT DOCUMENTS

| 2006/0018412 A1* | 1/2006 | Jung et al. ............ 375/341 |
| 2010/0106761 A1* | 4/2010 | Brunelli et al. ........ 708/446 |
| 2012/0087263 A1* | 4/2012 | Li et al. .............. 370/252 |
| 2012/0183098 A1* | 7/2012 | Choi et al. ............ 375/296 |

* cited by examiner

*Primary Examiner* — Michael Neff

(57) ABSTRACT

An automatic frequency control apparatus and method are provided. If the number of frequency error measurements is smaller than a reference number for frequency estimation compensation, the automatic frequency control apparatus performs frequency compensation using a frequency error value, and if the number of frequency error measurements is equal to or greater than the reference number for frequency estimation compensation, the automatic frequency control apparatus performs frequency compensation by estimating a frequency value that is to be used until the next frequency control period. Therefore, since frequency errors are accurately corrected in a high-speed mobile environment, an excellent channel environment may be maintained, and accordingly an occurrence frequency of re-transmission may be lowered, resulting in ensuring a high data rate.

12 Claims, 6 Drawing Sheets

APPARATUS AND METHOD FOR AUTOMATIC FREQUENCY PREDICTION CONTROL

CROSS-REFERENCE TO RELATED APPLICATION

This application claims the benefit under 35 U.S.C. §119 (a) of a Korean Patent Application No. 10-2010-0132736, filed on Dec. 22, 2010, the entire disclosure of which is incorporated herein by reference for all purposes.

BACKGROUND

1. Field

The following description relates to a frequency control technique for matching a frequency from a transmitting party to a frequency from a receiving party, and more particularly, to an automatic frequency control apparatus for automatically correcting a frequency error due to sharp changes in frequency generated when a mobile terminal moves quickly.

2. Description of the Related Art

Recently, many mobile communication techniques adopt an Orthogonal Frequency Division Multiple Access (OFDMA) scheme or a Single-Carrier FDMA (SC-FDMA) scheme. IEEE 802.16, 802.20 that is a standard for mobile internet system and a standard for Wibro system adopt the OFDMA scheme, and 3 Generation Partnership Project (3GPP) adopts use of the OFDMA and SC-FDMA schemes in a cellular communication system called Long Term Evolution (LTE).

However, communication methods based on the OFDMA or SC-FDMA scheme could not avoid performance deterioration due to noise since noise is generated in all transmission packets when a RF center frequency from a transmitting party does not accurately match that from a receiving party.

In order to solve such a performance deterioration problem, generally, a technique of measuring channel distortion by transmitting a reference signal to a predetermined resource space (that is, at a predetermined frequency and a predetermined time) to compensate for the channel distortion, thereby removing noise over entire data has been used.

SUMMARY

The following description relates to an automatic frequency control apparatus and method capable of maintaining an excellent channel environment by accurately correcting a frequency error in a high-speed mobile environment.

In one general aspect, there is provided an automatic frequency control apparatus. The automatic frequency control apparatus performs frequency compensation using a frequency error if the number of frequency error measurements is smaller than a reference number for frequency estimation compensation, and performs frequency compensation by estimating a frequency value that is to be used until the next frequency control period if the number of frequency error measurements is equal to or greater than the reference number for frequency estimation compensation.

Therefore, frequency errors may be accurately corrected in a high-speed mobile environment, an excellent channel environment may be maintained, and an occurrence frequency of re-transmission may be lowered, resulting in ensuring a high data rate.

Other features and aspects will be apparent from the following detailed description, the drawings, and the claims.

Figure 1:
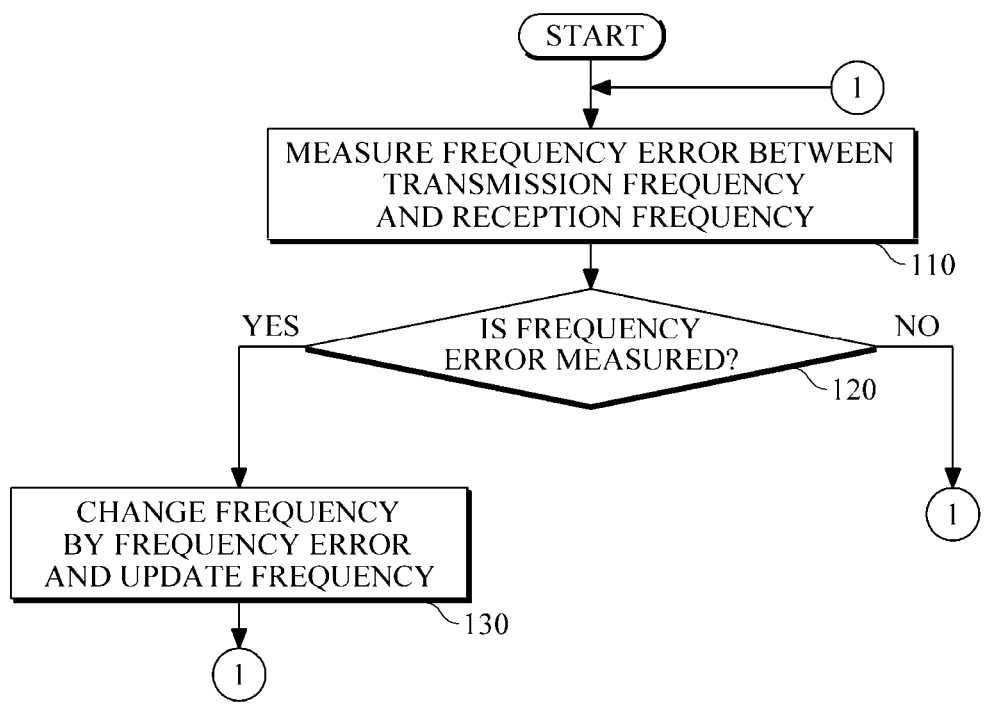
FIG. 1 is a flowchart illustrating an example of a frequency control method of correcting a frequency error using only the frequency error.

Throughout the drawings and the detailed description, unless otherwise described, the same drawing reference numerals will be understood to refer to the same elements, features, and structures. The relative size and depiction of these elements may be exaggerated for clarity, is illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a flowchart illustrating an example of a frequency control method of correcting a frequency error using only the frequency error. Referring to FIG. 1, the frequency control method measures an error between a transmitting frequency and a receiving frequency (110), determining whether or not there is an error between the transmitting and receiving frequencies (120), changing, when there is an error between the transmitting and receiving frequencies, the transmitting frequency or the receiving frequency by the measured error to update the transmitting or receiving frequency (130), thereby matching the transmitting frequency to the receiving frequency.

In other words, the frequency control method measures channel distortion to detect an error between an RF center frequency from a transmitting party and an RF center frequency from a receiving party, performs low pass filtering on the detected error to obtain a compensation value, and then changes the RF center frequency from the transmitting or receiving party by the compensation value to update the RF center frequency from the transmitting or receiving party, wherein the updated RF center frequency is maintained until the next update.

The frequency control method is suitable for systems not considering the case where a mobile terminal moves in high speed, since there is no significant change in RF center frequency is when a mobile terminal moves in low speed, that is, when Doppler Shift is ignorable. Also, the frequency control method can be effectively used in systems having no tight power requirements without being subject to re-transmission load since the systems allow a low data rate or are not used in a mobile environment.

In communication methods focusing on the case where a mobile terminal moves in low speed or does not move, generally, multipath fading influences channel estimation, which may cause frequency mismatch between a transmitting party and a receiving party. Such frequency mismatch may be compensated by inserting a cyclic prefix into data to be transmitted at a transmitting party and using a single tap equalizer at a receiving party upon data reception. After RF center frequency errors are compensated, there is the case where errors are found in decoded data. In this case, re-transmission is performed.

However, when a mobile terminal, etc. moves in high speed, there are sharp changes in RF center frequency between a transmitting party and a receiving party due to the Doppler Shift effect. In this case, if the RF center frequency received by the receiving party does not exactly match the RF center frequency transmitted by the transmitting party, the frequency error becomes great and the frequency error value tends to continue to change in a relatively short time due to the characteristics of the Doppler Shift effect.

Figure 2:
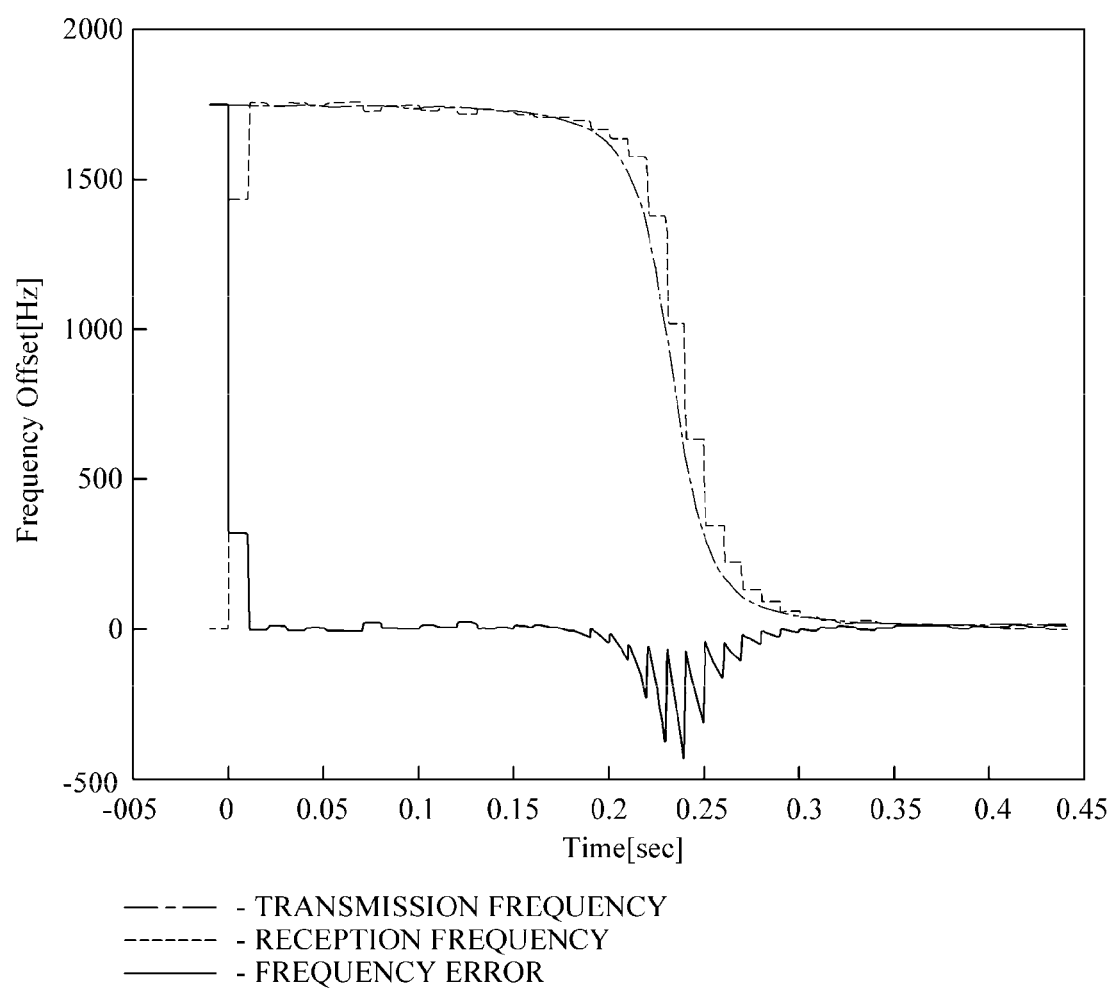
FIG. 2 is a graph showing changes in frequency with respect to time when the frequency control method of correcting a frequency error using only the frequency error is used.

FIG. 2 is a graph showing changes in frequency with respect to time when the frequency to control method of correcting a frequency error using only the frequency error is used. FIG. 2 shows that when the frequency changes based on the Doppler Shift, the frequency control method described above with reference to FIG. 1 causes a relatively great frequency error.

Accordingly, in order to correct a frequency error using only the frequency error, a process of performing channel estimation to continue to reduce a time period per which a frequency error is updated until a desired degree of frequency error is obtained is needed. However, if a frequency error compensation period is defined implicitly or explicitly on a communication standard, the method of correcting a frequency error using only the frequency error is not proper.

Specifically, in the case of Long Term Evolution (LTE), since a single subframe is 1 ms and a reference signal is included in unit of subframe, a minimum control period per which a RF center frequency is updated is 1 ms.

However, using an estimated value without further update may increase errors and also estimation itself may produce errors. Accordingly, it is general that values estimated in unit of 1 frame (10 ms) are accumulated and used for frequency compensation. Accordingly, when the method of correcting a frequency error using only the frequency error is used, a minimum control period is set to 10 ms.

However, in this case, since methods capable of controlling a frequency that sharply changes due to the Doppler Shift effect are limited, a communication method of reducing a data rate (that is, performing low order modulation) is generally used in a high-speed mobile environment that is subject to re-transmission load.

In order to provide an excellent data rate in a high-speed mobile environment, a frequency error compensation algorithm for shortening a control period is needed.

Figure 3:
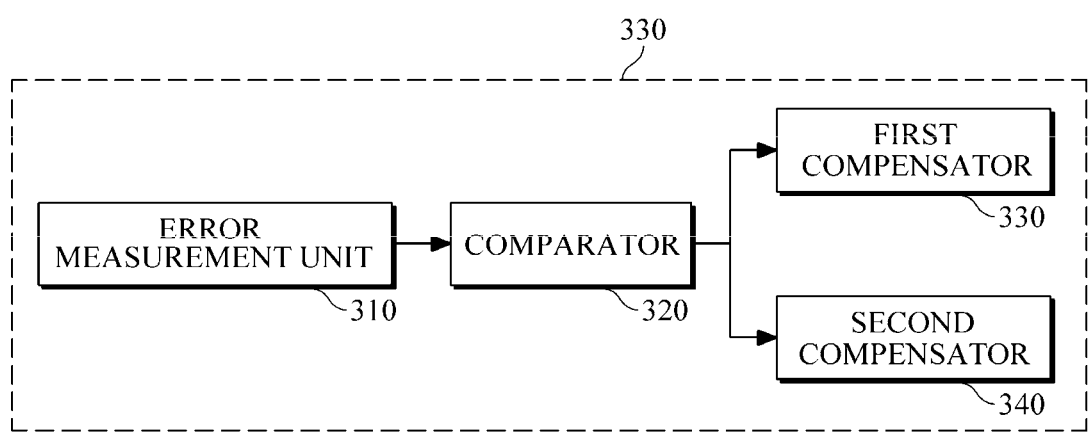
FIG. 3 is a block diagram illustrating an example of an automatic frequency control apparatus.

FIG. 3 is a block diagram illustrating an example of an automatic frequency control apparatus 300. The automatic frequency control apparatus 300 may be implemented as hardware, software, or their combination, which is installed in a mobile station or in a base station. Referring to FIG. 3, the automatic frequency control apparatus 300 includes an error measurement unit 310, a comparator 320, a first compensator 330, and a second compensator 340.

The error measurement unit 310 measures a frequency error between a transmission frequency and a reception frequency, and stores the measured frequency error in a memory. Here, a minimum memory size for which an error value is stored is dependent on what frequency estimation function is used for frequency estimation which will be described later.

If a linear polynominal is used for frequency estimation, two values are needed to obtain unknown variables a and b from "y=ax+b" that is a general form of linear polynominal. Accordingly, the minimum memory size becomes 1. If a quadratic polynominal is used for frequency estimation, three values are needed to obtain unknown variables a, b, and c from "y=ax$^2$+bx+c" that is a general form of quadratic polynominal, and accordingly, the minimum memory size becomes 2.

Then, the comparator 320 decides what method has to be used to compensate for the frequency error. For example, the frequency error may be compensated based on the number of frequency error measurements and a reference number for frequency estimation compensation, or a predetermined frequency compensation method may be used. The reference number for frequency estimation compensation is the number of frequency error measurements at which frequency estimation has to be started. Before frequency estimation is started, the method of correcting a frequency error using only the frequency error, which has been described above with reference to FIG. 1, is used for initialization.

The reference number for frequency estimation compensation may be the order of polynomial used as a frequency estimation function that is used for frequency estimation which will be described later. For example, if a linear polynominal is used as the frequency estimation function, the reference number for frequency estimation compensation is set to 1. Likewise, if a quadratic polynominal is used as the frequency estimation function, the reference number for frequency estimation compensation is set to 2.

If the compensator 320 determines that the number of frequency error measurements is smaller than the reference number for frequency estimation compensation, the first compensator 330 performs frequency compensation using the frequency error.

At this time, the first compensator 330 may change the transmission frequency by the frequency error so as to match the transmission frequency to the reception frequency, or may change the reception frequency by the frequency error so as to match the reception frequency to the transmission frequency.

Since the reference number for frequency estimation compensation is the number of frequency error measurements at which frequency estimation has to be started, the first compensator 330 performs frequency compensation using the frequency error until frequency estimation is started, that is, when the number of frequency error measurements is smaller than the reference number for frequency estimation compensation.

Meanwhile, if the comparator 320 determines that the number of frequency error measurements is equal to or greater than the reference number for frequency estimation compensation, the second compensator 340 performs frequency compensation by estimating a frequency value that is to be used until the next frequency control period.

That is, since frequency estimation is performed when the number of frequency error measurements is equal to or greater than the reference number for frequency estimation compensation, the second compensator 340 performs frequency compensation by estimating a frequency value that is to be used until the next frequency control period.

For example, the second compensator 340 performs frequency compensation, by estimating a reception frequency value that is to be used until the next frequency control period and that matches the transmission frequency, or by estimating a transmission frequency value that is to be used until the next frequency control period and that matches the reception frequency.

Meanwhile, the second compensator 340 may use a frequency estimation function with respect to time to estimate a frequency value that is to be used until the next frequency control period. The frequency estimation function with respect to time may be a polynominal, a transcendental function, etc., which can be arbitrarily selected by a user. For example, the frequency estimation function may be a linear or quadratic polynominal. The order of a polynominal used as the frequency estimation function may be selected by a user. Also, if a transcendental function is used as the frequency estimation function, the reference number for frequency estimation compensation depends on a selection from a user.

Figure 4:
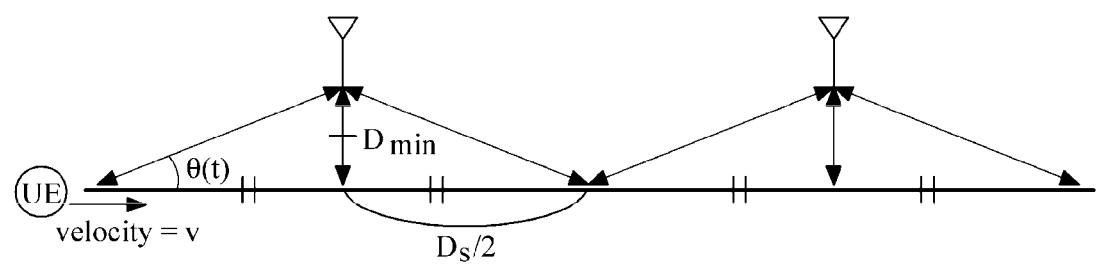
FIG. 4 is a conceptual view for explaining a high-speed mobile environment.

FIG. 4 is a conceptual view for explaining a high-speed mobile environment. In a high-speed mobile environment, a frequency offset due to the Doppler Shift, that is, a frequency estimation function can be represented as equation (3) below.

In the following equations (1), (2) and (3), $f_s(t)$ is an estimated frequency, $f_{dmax}$ is a maximum frequency value, $\theta(t)$ is an angle with respect to time between a mobile terminal and a base station on a data path, and $D_s$ is the distance between base stations.

$$f_s(t) = f_{d\,max} \cdot \cos\theta(t), \quad (1)$$

$$f_{d\,max} = 2\frac{v \cdot f_c}{c}, \text{ and} \quad (2)$$

$$\cos\theta(t) = \begin{cases} \dfrac{\dfrac{D_s}{2} - v \cdot t}{\sqrt{D_{min}^2 + \left(\dfrac{D_s}{2} - v \cdot t\right)^2}}, & 0 \le t \le \dfrac{D_s}{v} \\ \dfrac{-1.5D_s + v \cdot t}{\sqrt{D_{min}^2 + (-1.5D_s + v \cdot s)^2}}, & \dfrac{D_s}{v} \le t \le \dfrac{2D_s}{v} \\ \cos\theta\left(t\bmod\left(\dfrac{2D_s}{v}\right)\right), & t > \dfrac{2D_s}{v} \end{cases} \quad (3)$$

It is seen from the above equations (1), (2), and (3) that the frequency $f_s(t)$ changes most sharply at a point of $t=D_s/2v$ or $t=3D_s/2v$. At this time, the frequency offset $\cos\theta(t)$ may approximate equation (4) below. If $$t > \frac{2D_s}{v},$$

the frequency offset $\cos\theta(t)$ can be ignored.

Thus, equation (3) can be rewritten by equation (4) below.

$$\cos\theta(t) \approx \begin{cases} \dfrac{D_s/2 - v \cdot t}{D_{min}}, & 0 \le t \le \dfrac{D_s}{v} \\ \dfrac{-1.5D_s + v \cdot t}{D_{min}}, & \dfrac{D_s}{v} < t \le \dfrac{2D_s}{v} \end{cases} \quad (4)$$

Figure 5:
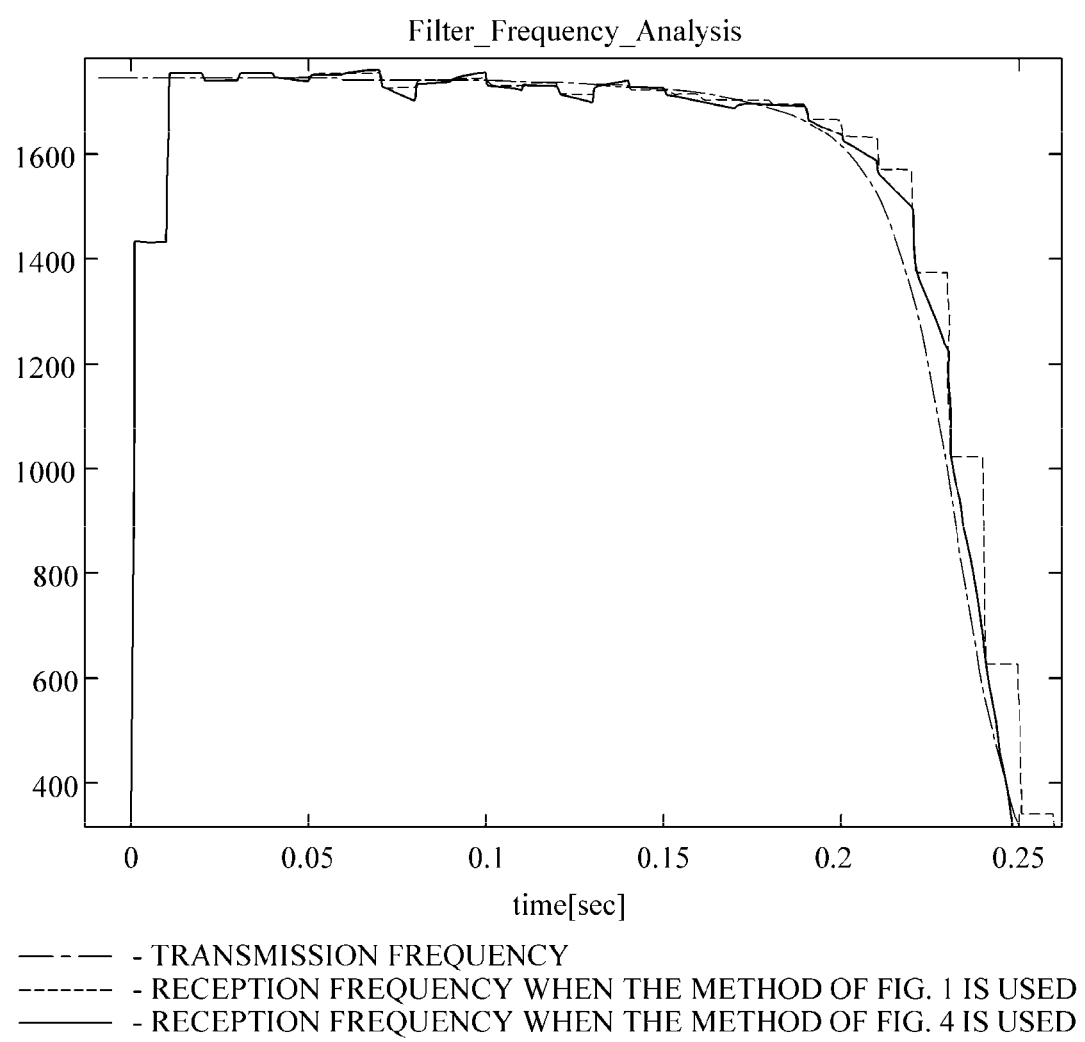
FIG. 5 is a graph showing changes in frequency with respect to time when the automatic frequency control apparatus is used to correct frequency errors.

Accordingly, a change in the frequency $f_s(t)$ is represented as a linear expression with respect to time. Referring to FIG. 5, comparing the case of correcting a frequency error using only the frequency error to the case of estimating and correcting a frequency using a frequency estimation function that is a linear polynominal, the case of using the frequency estimation function that is the linear polynominal shows a significantly small frequency error. FIG. 5 is a graph showing changes in frequency with respect to time when the automatic frequency control apparatus is used to correct a frequency error.

As described above, since the automatic frequency control apparatus performs frequency compensation using a frequency error value if the number of frequency error measurements is smaller than the reference number for frequency estimation compensation, and if the number of frequency error measurements is equal to or greater than the reference number for frequency estimation compensation, the automatic frequency control apparatus performs frequency compensation by estimating a frequency value that is to be used until the next frequency control period, frequency errors may be accurately corrected in a high-speed mobile environment, an excellent channel environment may be maintained, and accordingly an occurrence frequency of re-transmission may be lowered, resulting in ensuring a high data rate.

Figure 6:
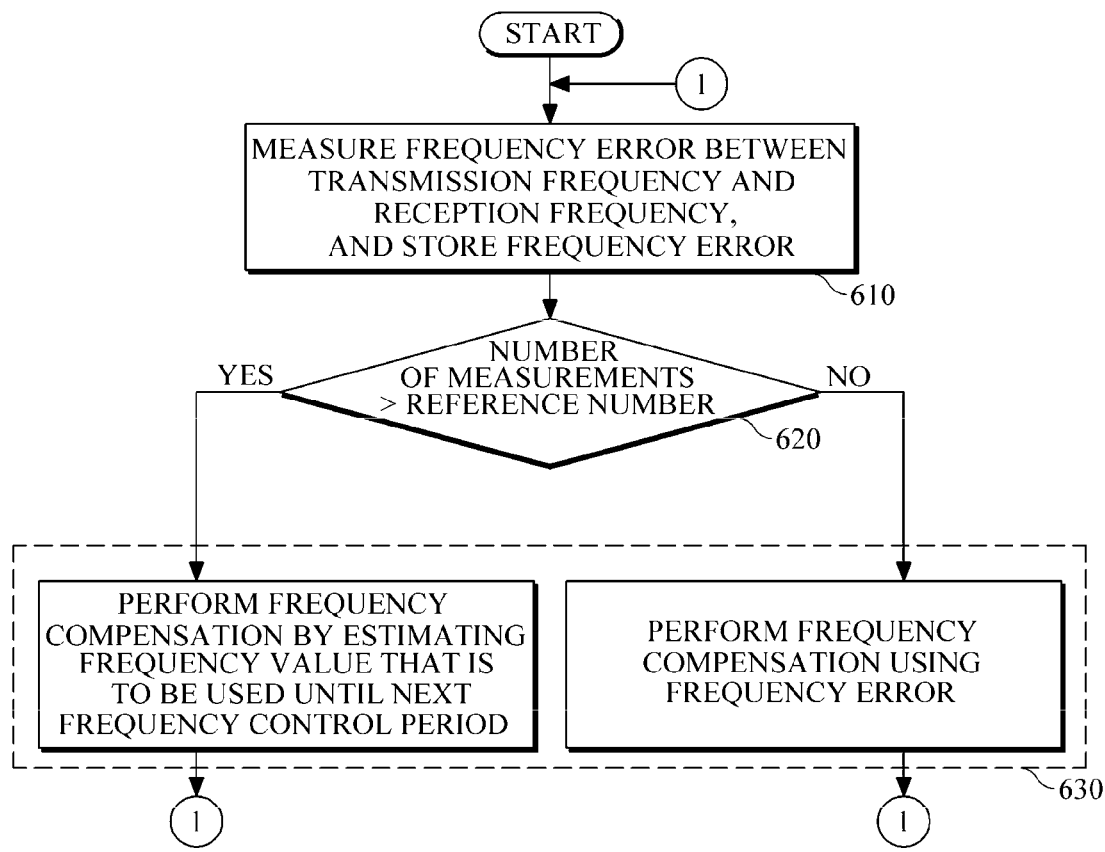
FIG. 6 is a flowchart illustrating an example of an automatic frequency control method.

Hereinafter, an automatic frequency control method that is performed by the automatic frequency control apparatus will be described with reference to FIG. 6. FIG. 6 is a flowchart illustrating the automatic frequency control method.

First, a communication apparatus measures a frequency error between a transmission frequency and a reception frequency, and stores the measured frequency error (610). Here, the communication apparatus may be a mobile terminal or a base station, and the mobile terminal is a receiving party and the base station is a transmitting party, or vice versa.

Then, the communication apparatus compares the number of frequency error measurements to a reference number for frequency estimation compensation (620). The reference number for frequency estimation compensation is the number of frequency error measurements at which frequency estimation has to be started. The reference number for frequency estimation compensation may be the order of a polynominal that is used as a frequency estimation function for frequency estimation.

Then, the communication apparatus performs frequency compensation by using the frequency error or by estimating a frequency value that is to be used until the next frequency control period, according to the comparison result obtained in operation 620.

If the number of frequency error measurements is smaller than the reference number for frequency estimation compensation, the communication apparatus may perform frequency compensation using the frequency error (630).

At this time, the communication apparatus performs frequency compensation by changing the transmission frequency by the frequency error so as to match the transmission frequency to the reception frequency, or by changing the reception frequency by the frequency error so as to match the reception frequency to the transmission frequency.

If the number of frequency error measurements is equal to or greater than the reference number for frequency estimation compensation, in operation 630, the communication apparatus may perform frequency compensation by estimating a frequency value that is to be used until the next frequency control period.

For example, in operation 630, the communication apparatus may match the reception frequency to the transmission frequency by estimating a reception frequency value that is to be used until the next frequency control period, or may match the transmission frequency to the reception frequency by estimating a transmission frequency value that is to be used until the next frequency control period.

Meanwhile, in operation 630, the communication apparatus may use a frequency estimation function with respect to time to estimate the frequency value that is to be used until the next frequency control period. The frequency estimation function with respect to time may be a linear or quadratic polynominal.

In this way, by performing frequency compensation using a frequency error value if the number of frequency error measurements is smaller than the reference number for frequency estimation compensation, and if the number of frequency error measurements is equal to or greater than the reference number for frequency estimation compensation, performing frequency compensation by estimating a frequency value that is to be used until the next frequency control period, frequency errors may be accurately corrected in a high-speed mobile environment, an excellent channel environment may be maintained, and accordingly an occurrence frequency of re-transmission may be lowered, resulting in ensuring a high data rate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An automatic frequency control apparatus, comprising:
   a frequency error measurement unit to measure a frequency error between a transmission frequency and a reception frequency and to store the frequency error;
   a comparator to compare the number of frequency error measurements performed by the frequency error measurement unit to a reference number for frequency estimation compensation;
   a first compensator to perform frequency compensation using the frequency error, when the number of frequency error measurements is smaller than the reference number for frequency estimation compensation; and
   a second compensator to perform frequency compensation by using a plurality of estimated frequency values, produced using a frequency estimation function with respect to time, to produce a plurality of changes in a compensated frequency at a corresponding plurality of times until the next frequency control period, when the number of frequency error measurements is equal to or greater than the reference number for frequency estimation compensation.

2. The automatic frequency control apparatus of claim 1, wherein the frequency estimation function with respect to time is a linear polynomial.

3. The automatic frequency control apparatus of claim 1, wherein the frequency estimation function with respect to time is a quadratic polynomial.

4. The automatic frequency control apparatus of claim 1, wherein the first compensator performs the frequency compensation by changing the transmission frequency by the frequency error to match the transmission frequency to the reception frequency.

5. The automatic frequency control apparatus of claim 1, wherein the first compensator performs the frequency compensation by changing the reception frequency by the frequency error to match the reception frequency to the transmission frequency.

6. The automatic frequency control apparatus of claim 1, wherein the second compensator performs the frequency compensation by estimating a reception frequency value that is to be used until the next frequency control period.

7. The automatic frequency control apparatus of claim 1, wherein the second compensator performs the frequency compensation by estimating a transmission frequency value that is to be used until the next frequency control period.

8. An automatic frequency control method which is performed by a communication apparatus, comprising:
   measuring a frequency error between a transmission frequency and a reception frequency and storing the frequency error;
   comparing the number of frequency error measurements performed by measuring a frequency error to a reference number for frequency estimation compensation;
   performing frequency compensation by using the frequency error until the next frequency control period, when the result of the comparison is a first determination; and
   performing frequency compensation by using a plurality of estimated frequency values, produced using a frequency estimation function with respect to time, to produce a plurality of changes in a compensated frequency at a corresponding plurality of times until the next frequency control period, when the result of the comparison is a second determination.

9. An automatic frequency control method for matching a transmission frequency and a reception frequency, comprising:
   performing one or more of frequency errors measurements between the transmission frequency and the reception frequency, each measurements producing a corresponding measured frequency error;
   when the number of frequency errors measurements is less than a reference number, perform frequency compensation during an interval before the next frequency control period using one of the measured frequency errors; and
   when the number of frequency errors measurements is greater than or equal to the reference number, perform frequency compensation during the interval before the next frequency control period using a plurality of estimated frequency values, produced using a frequency estimation function, to produce a plurality of changes in a compensated frequency at a corresponding plurality of times during the interval.

10. The method of claim 9, wherein at least one of the measured frequency errors is stored in a memory, and the frequency estimation function produces the frequency values according to a plurality of the measured frequency errors.

11. The method of claim 10, wherein the frequency estimation function is a polynomial and uses a number of measured frequency errors according to the order of the polynomial.

12. The method of claim 9, wherein the frequency estimation function is a transcendental function.

* * * * *